United States Patent
Stockhaus

(10) Patent No.: US 6,909,612 B2
(45) Date of Patent: Jun. 21, 2005

(54) CONNECTION SYSTEM

(75) Inventor: Andreas Stockhaus, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/244,812

(22) Filed: Sep. 16, 2002

(65) Prior Publication Data

US 2003/0058626 A1 Mar. 27, 2003

Related U.S. Application Data

(63) Continuation of application No. PCT/DE01/01091, filed on Mar. 15, 2001.

(30) Foreign Application Priority Data

Mar. 15, 2000 (DE) .......................... 100 13 843

(51) Int. Cl.⁷ ................................. H05K 7/00
(52) U.S. Cl. ................ 361/729; 361/726; 361/747
(58) Field of Search ................. 361/729, 130, 361/752, 797, 800, 726, 732, 747, 799, 730, 724, 714, 737, 152; 439/326, 496

(56) References Cited

U.S. PATENT DOCUMENTS

| | | | | |
|---|---|---|---|---|
| 4,227,237 A | | 10/1980 | Matthews et al. | |
| 5,603,629 A | * | 2/1997 | DeFrasne et al. | 439/331 |
| 5,734,558 A | | 3/1998 | Poplawski et al. | |
| 5,831,256 A | * | 11/1998 | De Larminat et al. | 235/486 |
| 6,106,317 A | * | 8/2000 | Michaelis et al. | 439/326 |
| 6,220,882 B1 | * | 4/2001 | Simmel et al. | 439/326 |
| 6,234,820 B1 | * | 5/2001 | Perino et al. | 439/326 |
| 6,383,027 B2 | * | 5/2002 | Cabane et al. | 439/630 |

FOREIGN PATENT DOCUMENTS

| | | |
|---|---|---|
| DE | 41 07 996 A1 | 9/1962 |
| DE | 1 930 859 U | 1/1966 |
| DE | 37 05 597 A1 | 10/1988 |
| DE | 44 32 028 A1 | 3/1995 |
| DE | 197 42 496 C1 | 2/1999 |
| DE | 299 13 281 U1 | 11/1999 |

* cited by examiner

*Primary Examiner*—Randy W. Gibson
*Assistant Examiner*—Hung S. Bui
(74) *Attorney, Agent, or Firm*—Laurence A. Greenberg; Werner H. Stemer; Ralph E. Locher

(57) ABSTRACT

A connection system detachably and mechanically connects an electronic component to a holder. The connection system has at least one stop element that provides a stopping position for the electronic component that is moved in relation to the holder. In the stopping position, the electronic component can be moved by a pivoting movement between an open position, wherein the electronic component can be separated from the holder, and an end position, wherein the detachable, mechanical connection is closed.

57 Claims, 6 Drawing Sheets

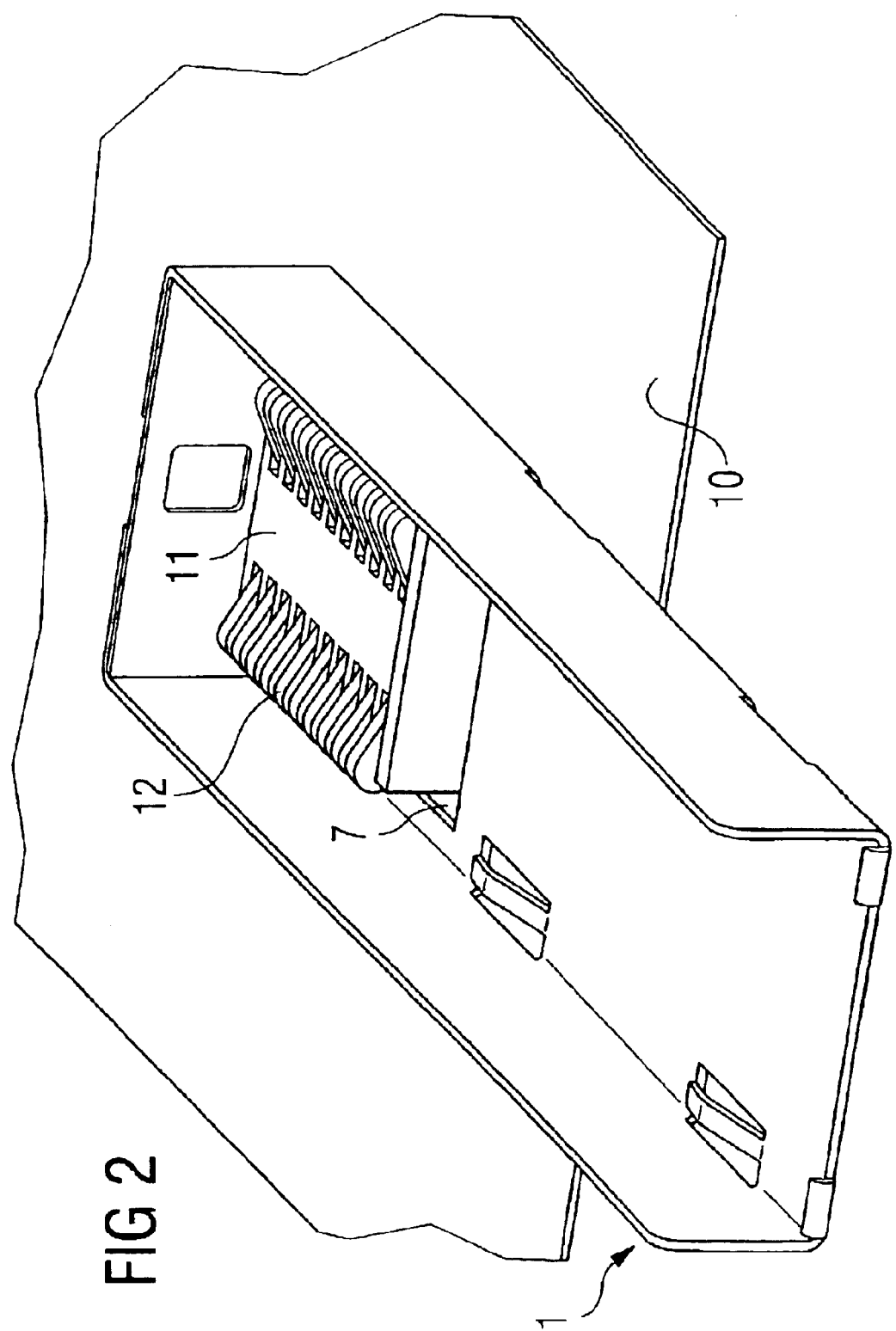

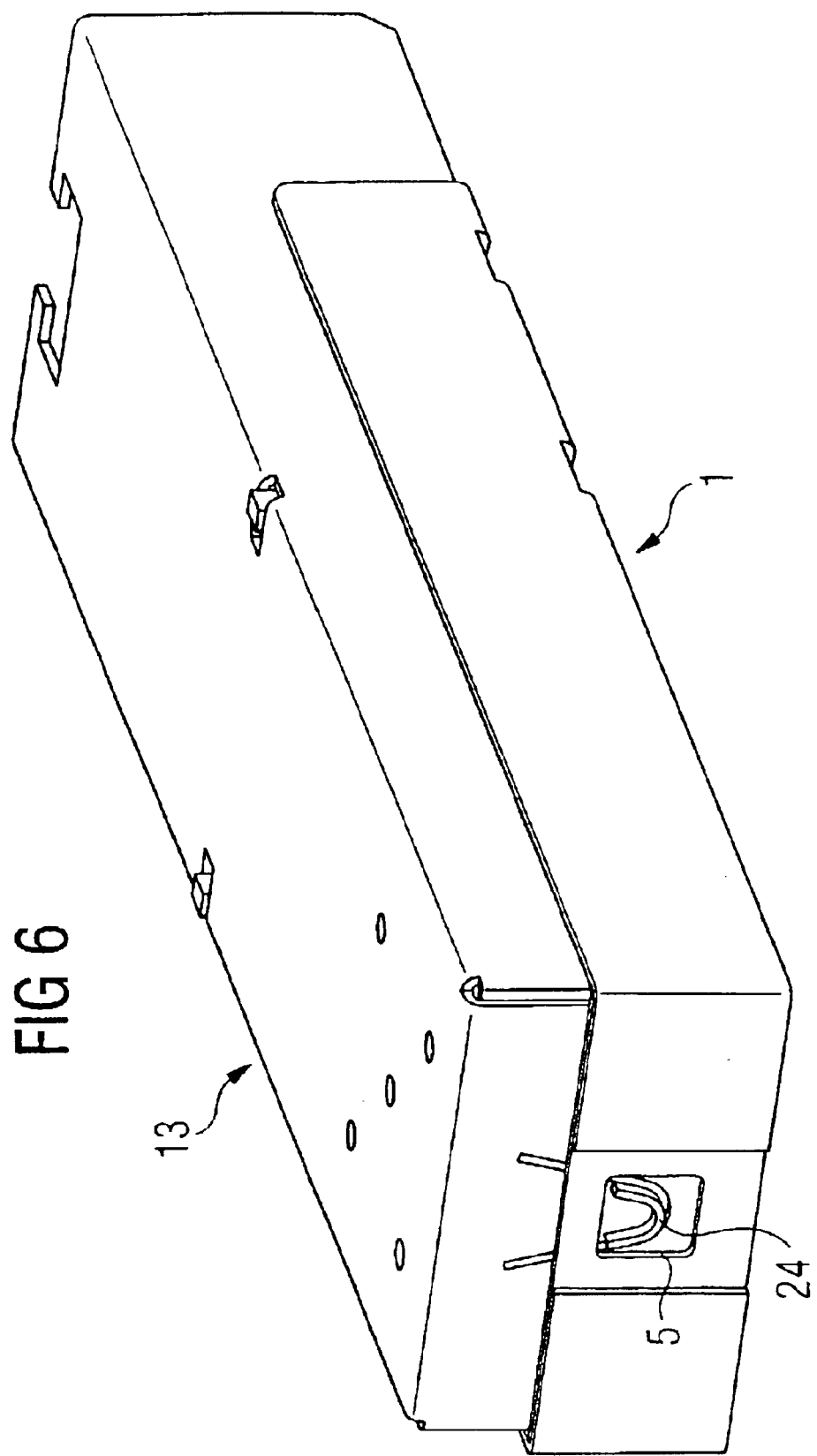

CONNECTION SYSTEM

CROSS-REFERENCE TO RELATED APPLICATION

This application is a continuation of copending International Application No. PCT/DE01/01091, filed Mar. 15, 2001, which designated the United States and was not published in English.

BACKGROUND OF THE INVENTION

Field of the Invention

The invention pertains to the field of mounting electronic components or modules, in particular electrooptical modules (transceivers, as they are known). When such modules are mounted on carriers, for example printed circuit boards provided with conductor tracks and connecting contacts, there is the demand from the user for modules that can be placed relatively freely and unrestrictedly on the printed circuit board. Here, module configurations and suitable mechanical connections are demanded which—depending on the available mounting space and accessibility—allow simple horizontal introduction of the modules into suitable holders or permit vertical mounting of the modules.

U.S. Pat. No. 5,734,558 reveals module variants each having a connecting-contact strip, which either projects at right angles on the underside of the module or passes through the narrow rear wall of the module area at the rear, as viewed in the insertion direction. The first module variant therefore only allows mounting exclusively at right angles to a holder, in which the sprung electric contacts of the contact strip on the module side penetrate vertically into correspondingly co-operating contacts of a contact receptacle on the holder side. For the purpose of assembly and disassembly, this variant requires a corresponding free space in the vertical direction above the holder. The other variant allows mounting only in a horizontal direction parallel to the upper side of the holder, which requires a corresponding clear space in front of the holder. Otherwise, in both variants, precise guidance of the module as it is connected to the holder is not provided.

SUMMARY OF THE INVENTION

It is accordingly an object of the invention to provide a connection system which overcomes the above-mentioned disadvantages of the prior art devices of this general type, which permits simple mounting with little expenditure on time, even when there is a small amount of free space available.

With the foregoing and other objects in view there is provided, in accordance with the invention, a connection system. The connection system contains an electronic component, and a holder having at least one stop element providing a stop position for the electronic component. The electronic component is movable relative to the holder. It being possible for the electronic component to move to the stop position, by a pivoting movement, between an open position, in which the electronic component can be separated from the holder, and an end position, in which the holder secures the electronic component.

The significant advantage achieved by the invention as compared with the prior art is that during mounting, in order to form the detachable mechanical connection, the electronic component can first be brought up to the holder while making optimum use of the existing free mounting space in order to bring the electronic component into the stop position, in which the position of the electronic component relative to the holder is at least partly defined with the aid of the stop element. The electronic component is then brought, by a pivoting movement, from the open position into the end position, the stop element ensuring that the electronic component and the holder move toward each other during the pivoting movement in such a way that the electronic component comes into the desired end position. The stop elements therefore permit a mounting sequence of the detachable mechanical connections in which, first, little space is required for the mounting. Second, the stop elements ensure that, during the transition into the end position, the electronic component and the holder are positioned in relation to each other in the stop position such that the mechanical connection is formed in the manner necessary for the function of the connection system.

An expedient development of the invention provides for the stop element to contain a protrusion which projects from a base of the holder, by which mechanically reliable stop elements are formed with little expenditure on production.

In a development of the invention, the at least one projecting protrusion is formed by an angled section of the base, as a result of which the protrusion is created by little expenditure on fabrication, without a method step being needed to fix the at least one protrusion to the base.

One advantageous refinement of the invention provides for the electronic component to have at least one protrusion which projects from a side wall of the electronic component, the protrusion interacting mechanically with the stop elements. In this way, interaction between the electronic component and the stop elements is ensured in a straightforward manner.

Provision can advantageously be made for the electronic component to be locked to the holder in the end position with the aid of a locking device, which provides a connection system that is secured against inadvertent detachment of the mechanical connection.

One expedient refinement of the invention provides for the locking device to contain a protrusion which is spring-mounted on the electronic component and which, in the end position of the electronic component, is disposed in a cut-out in the holder. In this way, a mechanically simple solution to the locking of the electronic component is provided, in which the locking and release of the locking between the electric component and the holder are made possible with little effort.

One embodiment of the invention which is preferred with regard to user friendliness provides a prestressing device that are formed in such a way that the electronic component is prestressed mechanically counter to the direction of the pivoting movement, at least over part of a distance covered during the pivoting movement from the open position into the end position. By this device, when the mechanical connection is being released, the electronic component initially moves automatically in a direction of the open position and can then be separated from the holder for the complete release of the mechanical connection.

In order to keep the number of parts of the connection system as low as possible, provision can be made for the prestressing device to be formed as part of an electrical ground contact connection of the electronic component. The prestressing device in this case fulfills both a mechanical and an electrical function.

A development of the invention which is expedient with regard to reliability of mounting provides that, in the open position, in the course of the pivoting movement and in the end position, one side face of the electronic component and one side face of the holder are disposed to rest on each other, at least to some extent. In this way, with respect to the position of the electronic component relative to the holder, a mounting aid in the form of a guide support is provided.

One preferred development of the invention provides for the holder to be a holder which can be mounted on a circuit board with the aid of the surface mounted device technique, which has soldering areas on a lower surface of the base, as a result of which the connection system can be used cost-effectively.

A development of the invention that is preferred with regard to the electrical connection to be formed with the aid of the connection system provides for the holder to contain a connecting component having connecting contacts which, in the end position, exert a spring force on connecting areas of the electric component. The spring force acting on the connecting areas additionally supports the release of the electric component from the end position.

Other features which are considered as characteristic for the invention are set forth in the appended claims.

Although the invention is illustrated and described herein as embodied in a connection system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a perspective of the holder with a connecting part;

FIG. 6 is a perspective view of the mounted connection system.

DESCRIPTION OF THE PREFERRED EMBODIMENTS

Figure 1A:
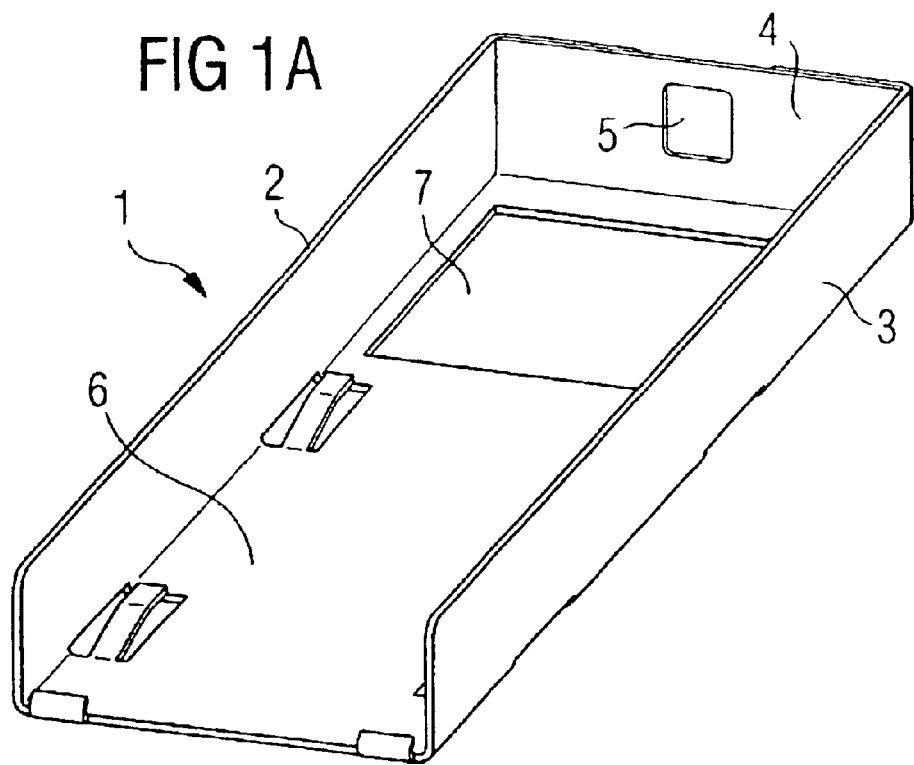
FIGS. 1A and 1B are perspective views of a holder from above and from below according to the invention.

Referring now to the figures of the drawing in detail and first, particularly, to FIG. 1A thereof, there is shown a perspective view of a holder 1. On a long side, the holder 1 has side walls 2, 3. An opening 5 is formed in a front wall 4. A further opening 7 is provided in a base 6 of the holder 1 and, as will be explained later in detail, is used to hold a connecting part.

Figure 1B:
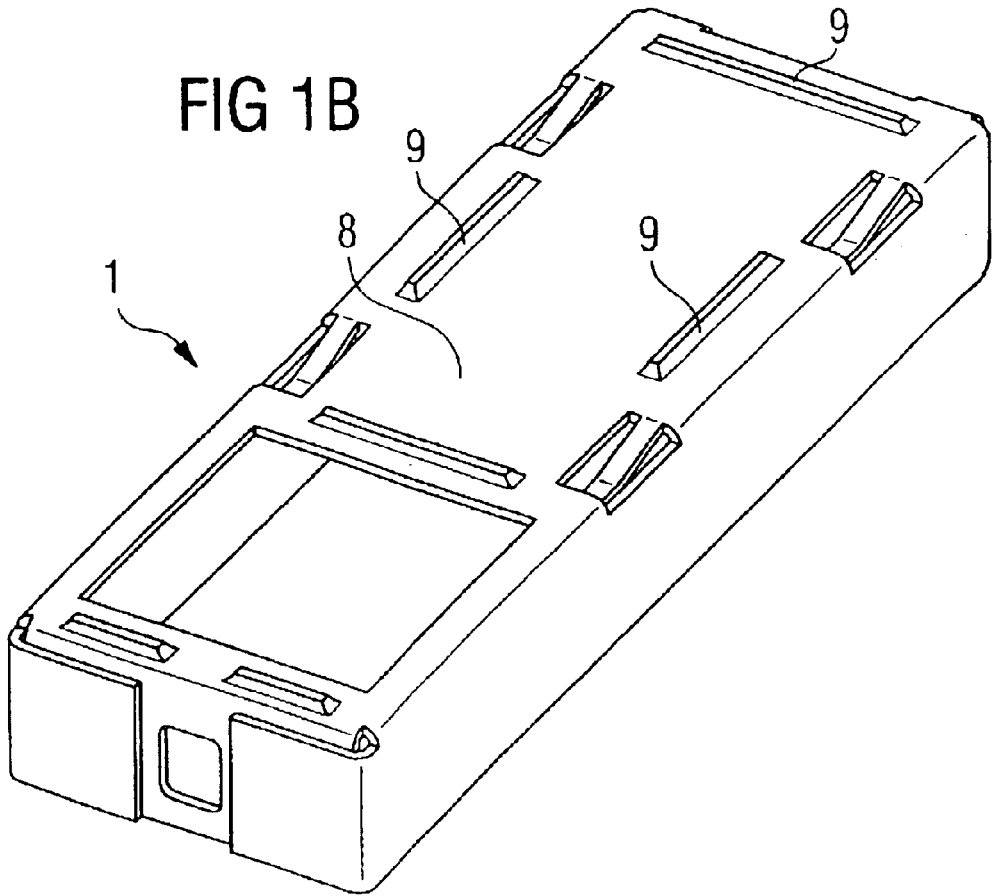

In FIG. 1B, the holder 1 from FIG. 1A is illustrated from below. The holder 1 has soldering areas 9 on an underside 8 of the base 6. With the aid of the soldering areas 9, the holder can be soldered onto a surface of a printed circuit board or circuit board. In this case, use is preferably made of a surface mounting device (SMD) technique.

FIG. 2 shows the holder 1 mounted on a circuit board 10, which is merely indicated. In this case, the holder 1 is mounted on the circuit board 10 in such a way that a connecting part 11 is disposed in the further opening 7 in the holder 1. The connecting part 11 has connecting contacts 12, which are preferably configured as spring contacts and, via conductor tracks on the circuit board 10, are connected to non-illustrated electric/electronic components, which can be disposed on the circuit board 10 or electrically connected to the non-illustrated conductor tracks of the circuit board 10.

Figure 3A:
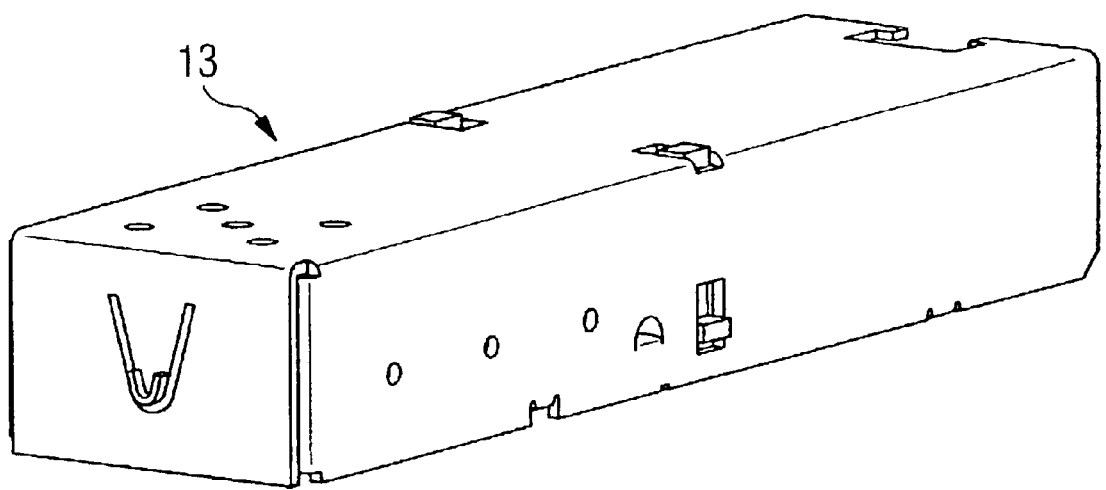
FIGS. 3A and 3B are perspective views of an electronic component from above and from below.

In order to form an electronic module, in particular an electrooptical module, an electronic component 13 illustrated in FIG. 3A is mounted on the holder 1. According to FIG. 3B, the electronic component 13 has a small printed circuit board 14 with connecting areas 15. When the electronic component 13 is mounted on the holder 1 (see FIG. 5B), the connecting contacts 12 formed as spring contacts exert a spring force on the connecting areas 15.

Figure 3B:
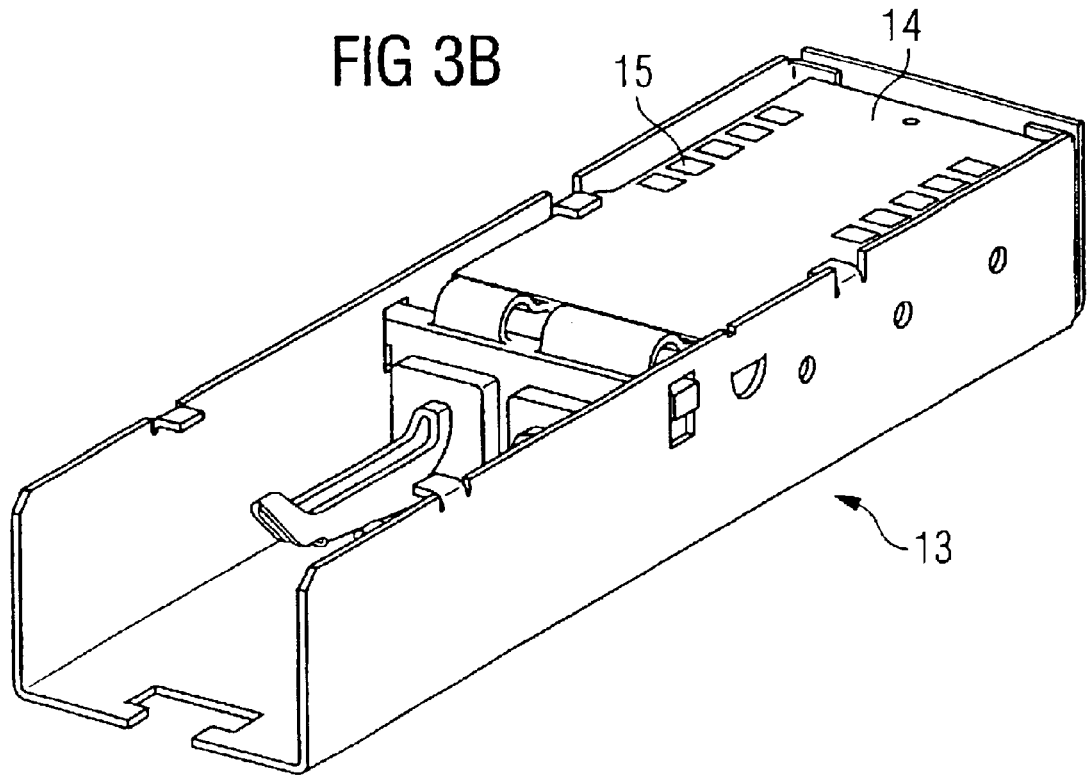
Figure 4:
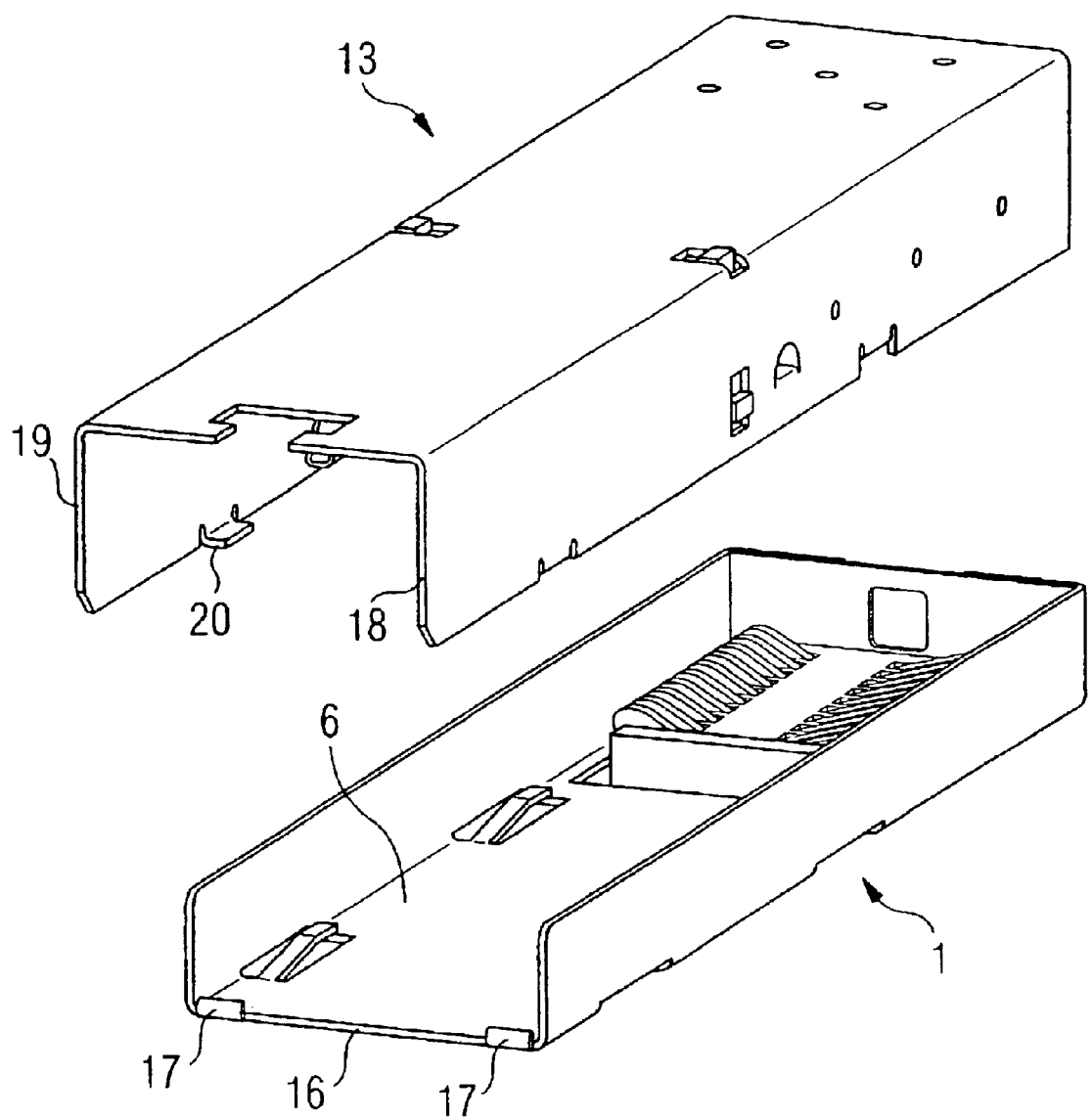
FIG. 4 is an exploded, perspective view of the electronic component being shown above the holder with the connecting part.
Figure 5A:
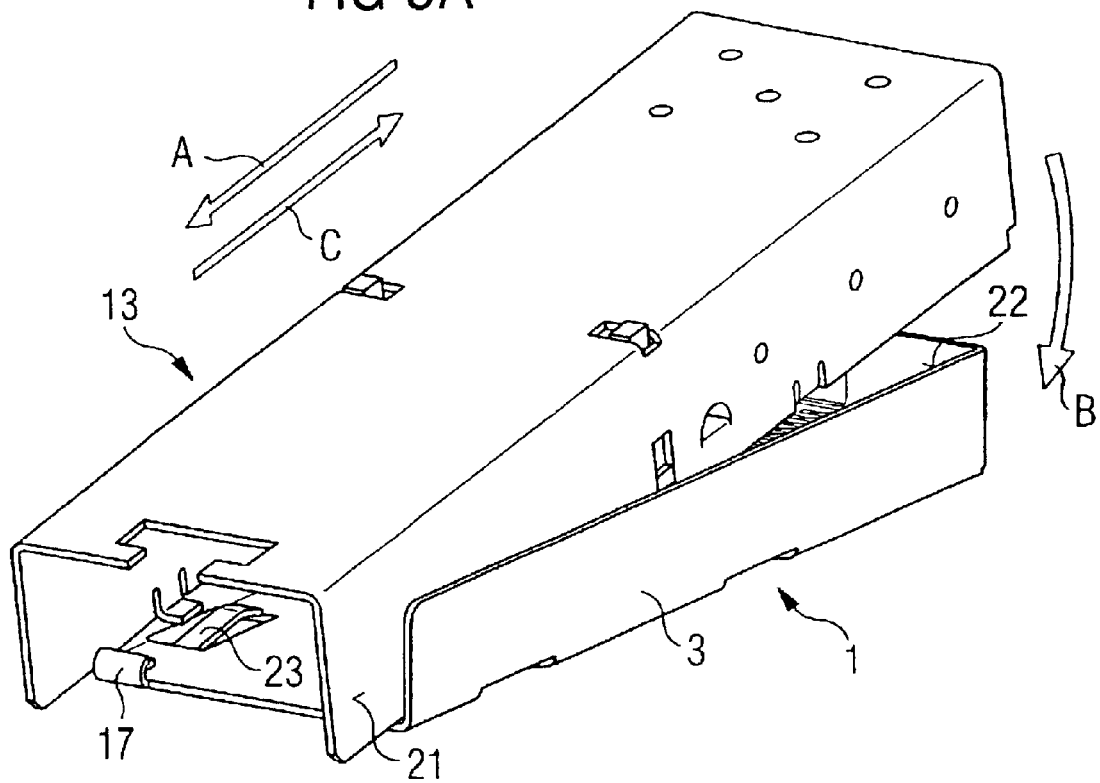
FIGS. 5A and 5B are perspective views of a connection system formed by the electronic component and the holder, the electronic component being partly or completely mounted on the holder.

FIG. 4 shows a perspective view, in which the electronic component 13 shown in FIGS. 3A and 3B is illustrated above the holder 1 from FIGS. 1A, 1B and 2. Formed on a front side 16 of the holder 1 are protrusions 17, which project upward from the base 6. According to FIG. 4, the electronic component 13 has further protrusions 20 in the lower region of side walls 18, 19. The protrusions 17 on an end 16 of the holder 1 serve as stop elements for the protrusions 20 on the electronic component 13 when the electronic component 13 is mounted on the holder 1. During the mounting operation, the electronic component according to FIG. 5A is moved toward the holder 1 substantially in a direction indicated by arrow A, until the further protrusions 20 on the electronic component 13 strike the protrusions 17 on the holder 1, so that the electronic component 13 is in a stop position. The electronic component 13 is then disposed in an open position with respect to the holder 1, in which slippage of the electronic component in the direction of the arrow A is prevented with the aid of the protrusions 17 and the further protrusions 20. The electronic component 13 is then moved, by a pivoting movement (see arrow B in FIG. 5A), into an end position that is illustrated in FIG. 5B.

Figure 5B:
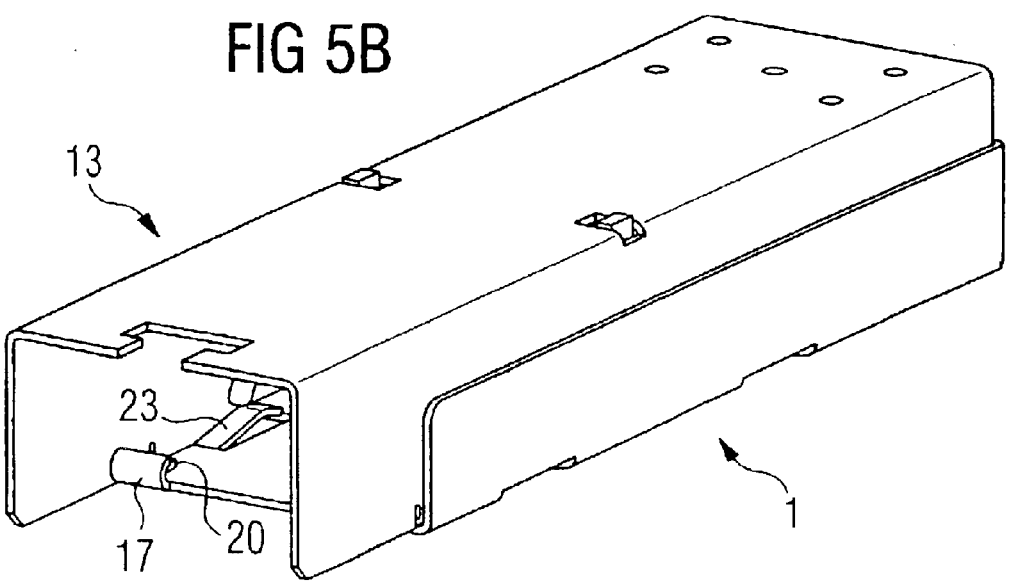

Both in the open position according to FIG. 5A and in the end position according to FIG. 5B, a side face 21 of the electronic component 13 is disposed at least partly on an inner face 22 of the side wall 3 of the holder 1. By this setup, the electronic component 13 is guided during the transition from the open position (see FIG. 5A) into the end position (see FIG. 5B).

During the transition from the open position (see FIG. 5A) into the end position (see FIG. 5B), a spring force must be overcome which is exerted on the electronic component 13 by sprung protrusions 23 (see FIG. 4, 5A and 5B).

According to FIG. 6, the electronic component 13 has a sprung protrusion 24 which is disposed at the end and which engages in the end opening 5 in the holder 1 when in the end position illustrated in FIG. 6. The spring force exerted on the base 6 of the holder 1 by the sprung protrusions 23 is used to press the electronic component 13 upward (counter to arrow B in FIG. 5A) when the locking formed with the aid of the sprung protrusion 24 between the electronic component 13 and the holder 1 is released, so that the electronic component 13 can be separated from the holder 1 in a direction which is indicated by arrow C in FIG. 5A.

I claim:

1. A connection system for a detachable mechanical connection of an electronic component, the connection system comprising:

a holder having at least one stop element, the electronic component being slideable in mechanical contact with and relative to said holder until contacting said at least one stop element for providing a stop position for the electronic component and defining an axis of rotation for the electronic component, the electronic component subsequently being pivotable about the axis of rotation relative to said holder between an open position, in which the electronic component can be separated from said holder, and an end position, in which said holder secures the electronic component.

2. The connection system according to claim 1, wherein said holder has a base, and said stop element contains a protrusion projecting from said base.

3. The connection system according to claim 2, wherein said protrusion is an angled section of said base.

4. The connection system according to claim 2, wherein said protrusion of said holder serves as said stop element contacting a designated protrusion of the electronic component at said stop position.

5. The connection system according to claim 2, wherein said holder has a front side and said stop element having said protrusion is disposed at said front side of said holder.

6. The connection system according to claim 2, wherein said protrusion is an angled section of said base.

7. The connection system according to claim 2, wherein said protrusion is an angled section of said base.

8. The connection system according to claim 2, wherein said protrusion is perpendicular with respect to said base.

9. The connection system according to claim 1, wherein the electronic component has a wide wall and at least one protrusion projecting from the side wall and interacting mechanically with said stop element of said holder.

10. The connection system according to claim 1, wherein in the end position, the electronic component is locked to said holder.

11. The connection system according to claim 10, wherein:
said holder has a cutout formed therein; and
said electronic component has a protrusion spring-mounted on said electronic component and the protrusion in the end position, is disposed in said cut-out of said holder.

12. The connection system according to claim 1, wherein said holder has a prestressing device formed such that the electronic component is prestressed mechanically counter to a direction of the pivoting movement, at least over part of a distance covered during the pivoting movement from the open position into the end position.

13. The connection system according to claim 12, wherein:
said holder has a base; and
said prestressing device contains sprung protrusions projecting from said base and exert a spring force on the electronic component over at least part of the distance covered during the pivoting movement.

14. The connection system according to claim 12, wherein said prestressing device forms part of an electrical ground contact connection of the electronic component.

15. The connection system according to claim 1, wherein in the open position, in a course of the pivoting movement and in the end position, one side face of the electronic component and one side face of said holder are disposed to rest on each other, at least to some extent.

16. The connection system according to claim 1, wherein said holder can be mounted using a surface mounted device technique and has a base with a lower surface and soldering areas disposed on said lower surface.

17. The connection system according to claim 1, wherein said holder has a connecting component with connecting contacts, said connecting contacts in the end position, exert a spring force on connecting areas of the electronic component.

18. The connection system according to claim 1, wherein said stop element is in contact with a protrusion of the electronic component in the stop position, the protrusion standing away from a side wall of the electronic component in a direction perpendicular to a relative movement of the electronic component.

19. The connection system according to claim 1, wherein said holder and the electronic component each have two side walls whereby a side wall of said holder and a side wall of the electronic component in the open position are, in each case, disposed at least partially adjacent to each other during a course of the pivoting movement and in the end position.

20. The connection system according to claim 1, wherein:
said holder and the electronic component each have two side walls whereby a side wall of said holder and a side wall of the electronic component in the open position are, in each case, disposed at least partially adjacent to each other during a course of the pivoting movement and in the end position; and
said stop element being in contact with a protrusion of the electronic component in the stop position, the protrusion standing away from the side wall of the electronic component in a direction perpendicular to a relative movement of the electronic component.

21. The connection system according to claim 1, further comprising a prestressing device prestressing the electronic component to counter a pivotal movement towards said end position.

22. A connection system, comprising:
an electronic component; and
a holder having at least one stop element, said electronic component being slideable in mechanical contact with and relative to said holder until contacting said at least one stop element for providing a stop position for said electronic component and defining an axis of rotation for the electronic component, the electronic component subsequently being pivotable about the axis of rotation relative to said holder between an open position, in which said electronic component can be separated from said holder, and an end position, in which said holder secures said electronic component.

23. The connection system according to claim 22, wherein said holder has a base, and said stop element contains a protrusion projecting from said base.

24. The connection system according to claim 23, wherein said protrusion is perpendicular with respect to said base.

25. The connection system according to claim 23, wherein said holder has a front side and said stop element having said protrusion is disposed at said front side of said holder.

26. The connection system according to claim 22, wherein said electronic component has a protrusion and said protrusion of said holder serves as said stop element for said protrusion of said electronic component.

27. The connection system according to claim 22, wherein in the end position, said electronic component is locked to said holder.

28. The connection system according to claim 27, wherein:
said holder has a cutout formed therein; and
said electronic component has a protrusion spring-mounted on said electronic component and acting as a locking device, said
protrusion in the end position, is disposed in said cut-out of said holder.

29. The connection system according to claim 22, wherein said holder has a prestressing device formed such that said electronic component is prestressed mechanically counter to a direction of the pivoting movement, at least over part of a distance covered during the pivoting movement from the open position into the end position.

30. The connection system according to claim 29, wherein:
said holder has a base; and said prestressing device contains sprung protrusions projecting from said base and exert a spring force on said electronic component over at least part of the distance covered during the pivoting movement.

31. The connection system according to claim 29, wherein said electronic component has an electrical ground contact connection, and said prestressing device forms part of said electrical ground contact connection.

32. The connection system according to claim 22, wherein in the open position, in a course of the pivoting movement and in the end position, one side face of said electronic component and one side face of said holder are disposed to rest on each other, at least to some extent.

33. The connection system according to claim 22, wherein said holder can be mounted using a surface mounted device technique and has a base with a lower surface and soldering areas disposed on said lower surface.

34. The connection system according to claim 22, wherein:
said electronic component has connecting areas; and said holder has a connecting component with connecting contacts, said connecting contacts in the end position, exert a spring force on said connecting areas of said electronic component.

35. The connection system according to claim 22, wherein said electronic element has a side wall and a protrusion, said stop element is in contact with said protrusion in the stop position, said protrusion standing away from said side wall of said electronic component in a direction perpendicular to a relative movement of said electronic component.

36. The connection system according to claim 22, wherein said holder and said electronic component each have two side walls whereby a side wall of said holder and a side wall of said electronic component in the open position are, in each case, are disposed at least partially adjacent to each other during a course of the pivoting movement and in the end position.

37. The connection system according to claim 22, wherein:
said holder and said electronic component each have two side walls whereby a side wall of said holder and a side wall of said electronic component in the open position are, in each case, are disposed at least partially adjacent to each other during a course of the pivoting movement and in the end position; and
said electronic element has a side wall and a protrusion, said stop element is in contact with said protrusion of said electronic component in the stop position, said protrusion of said electronic component standing away from said side wall of said electronic component in a direction perpendicular to a relative movement of said electronic component.

38. The connection system according to claim 22, further comprising a prestressing device prestressing said electronic component to counter a pivotal movement towards said end position.

39. The connection system according to claim 22, wherein said electronic component has a side wall and at least one protrusion projecting from said side wall and said protrusion interacting mechanically with said stop element of said holder.

40. A connection system for a detachable mechanical connection of an electronic component to a holder, the connection system comprising:
at least one stop element disposed on the holder, said stop element providing a stop position for the electronic component and defining an axis of rotation for the electronic component, the electronic component being slideable in mechanical contact with and relative to said holder until contacting said at least one stop element, the electronic component subsequently being pivotable about the axis of rotation relative to said holder between an open position, in which the electronic component can be separated from the holder, and an end position, in which the holder secures the electronic component.

41. The connection system according to claim 40, wherein the holder has a base, and said stop element contains a protrusion projecting from the base.

42. The connection system according to claim 41, wherein said stop element having said protrusion is disposed at a front side of the holder.

43. The connection system according to claim 41, wherein said protrusion is perpendicular with respect to said base.

44. The connection system according to claim 41, wherein the electronic component has a protrusion and said protrusion serves as said stop element for the protrusion of said electronic component.

45. The connection system according to claim 40, further comprising a locking device and in the end position, the electronic component is locked to the holder by said locking device.

46. The connection system according to claim 45, wherein:
the holder has a cutout formed therein; and
said locking device has a protrusion spring-mounted on the electronic component and said protrusion in the end position, is disposed in the cut-out of the holder.

47. The connection system according to claim 40 further comprising a prestressing device formed such that the electronic component is prestressed mechanically counter to a direction of the pivoting movement, at least over part of a distance covered during the pivoting movement from the open position into the end position.

48. The connection system according to claim 47, wherein:
the holder has a base; and
said prestressing device contains sprung protrusions projecting from said base and exert a spring force on the electronic component over at least part of the distance covered during the pivoting movement.

49. The connection system according to claim 47, wherein said prestressing device forms part of an electrical ground contact connection of the electronic component.

50. The connection system according to claim 40, wherein in the open position, in a course of the pivoting movement and in the end position, one side face of the electronic component arid one side face of said holder are disposed to rest on each other, at least to some extent.

51. The connection system according to claim 40, wherein the holder can be mounted using a surface mounted device technique and has a base with a lower surface and soldering areas disposed on the lower surface.

52. The connection system according to claim 40, wherein the holder has a connecting component with connecting contacts, the connecting contacts in the end position, exert a spring force on connecting areas of the electronic component.

53. The connection system according to claim 40, wherein said electronic element has a side wall and a protrusion, said stop element is in contact with the protrusion in the stop position, the protrusion standing away from the side wall of said electronic component in a direction perpendicular to a relative movement of the electronic component.

54. The connection system according to claim 40, wherein the holder and the electronic component each have two side walls whereby a side wall of the holder and a side wall of the electronic component in the open position are, in each case, disposed at least partially adjacent to each other during a course of the pivoting movement and in the end position.

55. The connection system according to claim 40, wherein:

the holder and the electronic component each have two side walls whereby a side wall of the holder and a side wall of the electronic component in the open position are, in each cases disposed at least partially adjacent to each other during a course of the pivoting movement and in the end position; and the electronic element has a side wall and a protrusion, said stop element is in contact with the protrusion of the electronic component in the stop position, the protrusion of the electronic component standing away from the side wall of the electronic component in a direction perpendicular to the relative movement of the electronic component.

56. The connection system according to claim 40, further comprising a prestressing device prestressing said electronic component to counter a pivotal movement towards said end position.

57. The connection system according to claim 40, wherein the electronic component has a side wall and at least one protrusion projecting from the side wall and interacting mechanically with said stop element.

* * * * *